United States Patent
Lin et al.

(10) Patent No.: US 8,212,706 B1
(45) Date of Patent: Jul. 3, 2012

(54) THRESHOLD DRIVEN DYNAMIC COMPARATOR

(75) Inventors: Hung Sheng Lin, San Jose, CA (US); Shafiq Jamal, Gilroy, CA (US); Shingo Hatanaka, San Jose, CA (US); Xiaoyue Wang, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 48 days.

(21) Appl. No.: 12/822,443

(22) Filed: Jun. 24, 2010

Related U.S. Application Data (60) Provisional application No. 61/228,902, filed on Jul. 27, 2009.

(51) Int. Cl.
*H03M 1/34* (2006.01)

(52) U.S. Cl. ........ 341/164; 341/118; 341/120; 341/155; 341/165

(58) Field of Classification Search .......... 341/118–121, 341/143, 155, 164, 165
See application file for complete search history.

(56) References Cited

U.S. PATENT DOCUMENTS

| | | | | |
|---|---|---|---|---|
| 4,246,571 A * | 1/1981 | Gariazzo | | 341/143 |
| 5,825,316 A * | 10/1998 | Kuttner | | 341/120 |
| 6,496,126 B2 * | 12/2002 | Zhan et al. | | 341/139 |
| 6,608,582 B2 * | 8/2003 | Casper et al. | | 341/155 |
| 7,158,068 B2 * | 1/2007 | Kobayashi et al. | | 341/155 |
| 7,209,069 B2 * | 4/2007 | Felder | | 341/163 |
| 7,835,470 B2 * | 11/2010 | Exeter | | 375/340 |
| 7,961,126 B2 * | 6/2011 | Deval et al. | | 341/131 |
| 2003/0179124 A1 * | 9/2003 | Harada | | 341/161 |
| 2004/0032353 A1 * | 2/2004 | Kattan | | 341/131 |
| 2010/0309035 A1 * | 12/2010 | Yue et al. | | 341/141 |

* cited by examiner

*Primary Examiner* — Linh Nguyen (57) ABSTRACT

In one embodiment, a method receives an analog input voltage. The method also receives a threshold from a plurality of thresholds. A comparator performs a comparison of the input voltage with the received threshold and outputs an output value based on the comparison of the analog input voltage with the received threshold. The output value is for converting the analog input voltage to a digital value. The method determines if the threshold should be adjusted based on the comparison and adjusts the threshold when it is determined the threshold should be adjusted.

18 Claims, 7 Drawing Sheets

THRESHOLD DRIVEN DYNAMIC COMPARATOR

CROSS REFERENCE TO RELATED APPLICATIONS

The present disclosure claims priority to U.S. Provisional App. No. 61/228,902 for "Threshold Driven Dynamic Comparator" filed Jul. 27, 2009, the contents of which are incorporated herein by reference in their entirety.

BACKGROUND

Particular embodiments generally relate to a threshold driven comparator.

Unless otherwise indicated herein, the approaches described in this section are not prior art to the claims in this application and are not admitted to be prior art by inclusion in this section.

Comparators may be used to compare an input voltage with a reference voltage. The output of the comparator indicates which of the input voltage and the reference voltage is larger or smaller. When multiple thresholds are being compared, a comparator is used to compare each threshold.

Pipelined ADCs may be used to convert an analog signal to a digital signal. A pipelined ADC includes a number of stages that each resolve a portion of bits for an N bit digital value of the digital signal. Each stage requires a number of comparators where more comparators are needed per stage as the number of bits being resolved increases. For example, if 1.5 bits are being resolved per stage, 2 comparators are needed, and if 2.5 bits are being resolved per stage, 6 comparators are needed. The comparators that are needed use area on an integrated circuit (IC) chip and also cause power loss.

SUMMARY

In one embodiment, a method receives an analog input voltage. The method also receives a threshold from a plurality of thresholds. A comparator performs a comparison of the analog input voltage with the received threshold and outputs an output value based on the comparison of the analog input voltage with the received threshold. The output value is for converting the analog input voltage to a digital value. The method determines if the threshold should be adjusted based on the comparison and adjusts the threshold when it is determined the threshold should be adjusted.

In one embodiment, the method determines when a time period in a sample phase has elapsed and freezes the threshold such that the threshold is not adjusted again until the sample phase ends.

In one embodiment, the method determines a plurality of decisions based on comparisons of the analog input voltage with thresholds in the plurality of thresholds. The output value is based on the plurality of decisions.

In another embodiment, an apparatus includes a multiplexer that outputs a threshold from a plurality of threshold values. A comparator receives an analog input voltage and the threshold from the multiplexer. The comparator then performs a comparison of the analog input voltage with the received threshold and outputs an output value based on the comparison of the input voltage with the received threshold. The output value is for converting the analog input voltage to a digital value. Circuitry determines if the threshold should be adjusted based on the comparison and causes the multiplexer to adjust the threshold when it is determined the threshold should be adjusted.

In one embodiment, circuitry determines when a time period in a sample phase has elapsed. The selection signal is not output thereby freezing the threshold such that the threshold is not adjusted again until the sample phase ends.

In one embodiment, the circuitry receives the output value for the threshold from the comparator. The circuitry determines if the output value indicates that the analog input voltage has passed the threshold. The selection signal is output to the multiplexer to cause the multiplexer to adjust the threshold if the analog input voltage has passed the threshold and not output the selection signal to the multiplexer if the analog input voltage has not passed the threshold.

In one embodiment, the comparator determines a plurality of decisions based on comparisons of the analog input voltage with thresholds in the plurality of thresholds. The output value is based on the plurality of decisions.

In another embodiment, the apparatus is a stage in an analog to digital converter.

The following detailed description and accompanying drawings provide a more detailed understanding of the nature and advantages of the present invention.

DETAILED DESCRIPTION

Described herein are techniques for a threshold driven comparator. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
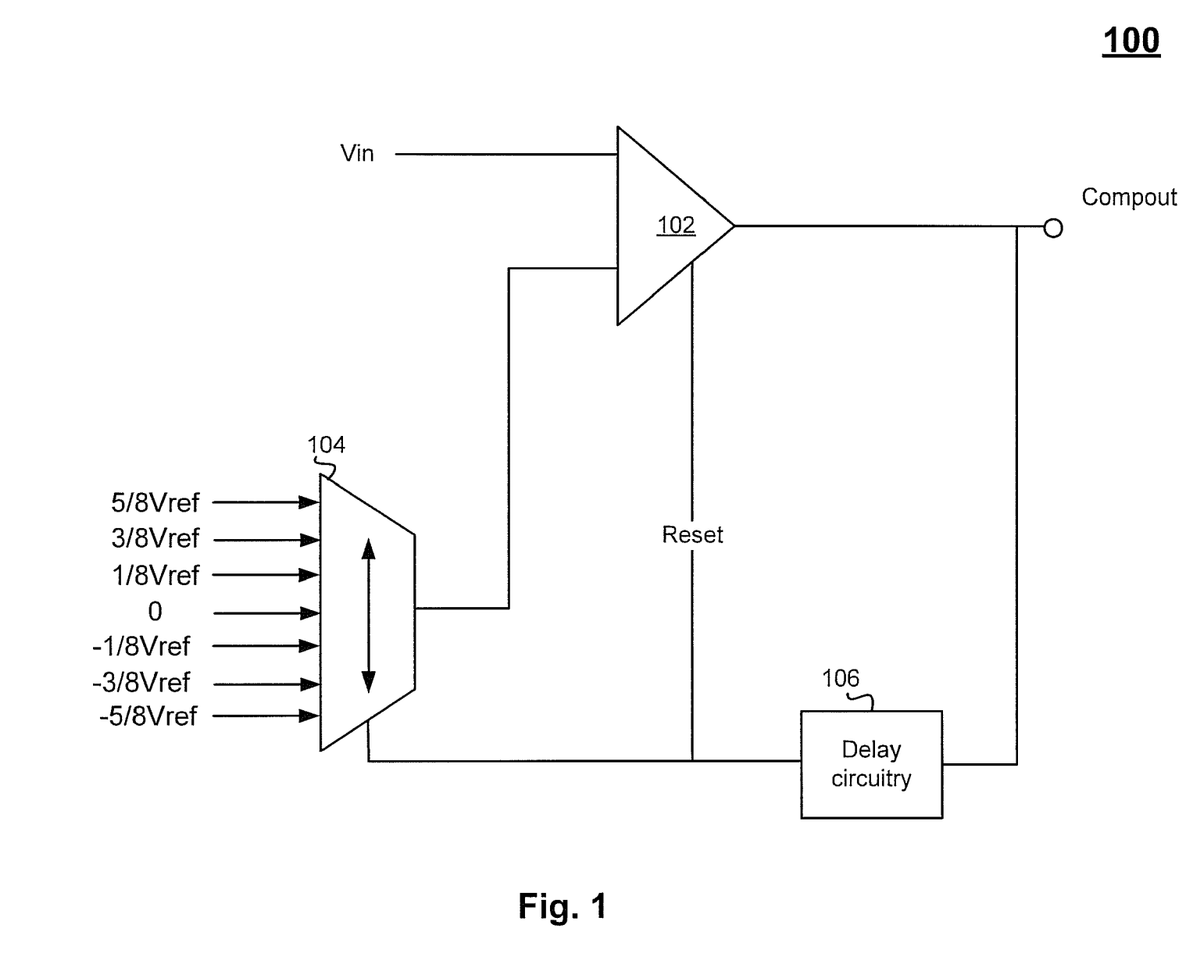
FIG. 1 depicts an example of a threshold driven comparator according to one embodiment.

FIG. 1 depicts an example of a system 100 for a threshold driven comparator according to one embodiment. In one embodiment, system 100 may be part of a stage for an analog to digital converter (ADC). However, system 100 may be used in other implementations where multiple comparisons of threshold are used. System 100 includes a comparator 102, a multiplexer 104, and delay circuitry 106. Comparator 102 is used to output a plurality of output values (Compout) based on comparison decisions of an analog input voltage (Vin) and threshold values output from multiplexer 104. The plurality of output values may be used to convert the analog input voltage to a digital value. For example, the output values may each be a logic high (e.g., "1") or logic low (e.g., "0") value for a bit in the digital value. The output values for the stage may later be error corrected to determine the final digital value.

Depending on the number of bits to be resolved by comparator 102, a different number of comparison decisions may be made to determine the plurality of output values. A comparison decision represents the decision of comparator 102 as to whether the input voltage is above or below a threshold value. Different comparison decisions are made for different thresholds. For example, if 2.5 bits are to be resolved, then 3 comparison decisions may be made to determine 3 bits. It is a 2.5 bit resolution because the least significant bit that is resolved may be error-corrected in a subsequent stage. The output of the comparison decisions may be used by the ADC to determine the digital value. For example, each comparison may correspond to a bit in the digital value. If the comparison indicates that the input voltage is above the threshold for a positive input voltage (or below the threshold for a negative input voltage), then the bit may be set at a high logic value (e.g., 1). If the comparison indicates that the input voltage is below the threshold for the positive input voltage (or above the threshold for the negative input voltage), then the bit may be set at a low logic value (e.g., 0).

Particular embodiments use a single comparator 102 to perform the comparisons for the stage. Multiple thresholds may be used that may be input into comparator 102. Thus, area on an integrated circuit (IC) chip is saved because less comparators are needed to resolve N bits in the stage. For example, conventionally, $2^N-1$ comparators were needed to resolve N bits. However, particular embodiments use a single comparator 102 that receives multiple thresholds at different times to perform the comparisons. As will be described below, using comparator 102 also uses less power and is accurate.

Multiplexer 104 receives a plurality of thresholds. The thresholds may be a portion of a reference voltage (Vref). The reference voltage may be a full-scale voltage that can be measured by comparator 102. The thresholds may be positive and negative, and the number of thresholds used depends on the resolution of the stage. In one embodiment, for a 2.5b stage, a zero threshold, three positive thresholds of ⅝, ⅜, and ⅛ of the reference voltage, and three negative thresholds of −⅛, −⅜, and −⅝ of the reference voltage are used. It will be understood that other portions of the reference voltage may be used. Also, if the stage is resolving a different number of bits, then a different number of thresholds may be used. For example, for a 1.5 bit stage, 3 thresholds may be used.

In one embodiment, each threshold may be used to determine a bit in the digital value. For example, for a positive input voltage, the input voltage is compared to the ⅛ threshold. If the input voltage is above the ⅛ threshold, then a most significant bit (MSB) in the digital value may be set to "1" because the input voltage is greater than the value of ⅛ of the reference voltage. The next comparison is made with the next threshold, the ⅜ threshold. If the input voltage is above the ⅜ threshold, then the next bit in the digital value may be set to "1" because the input voltage is greater than the value of ⅜ of the reference voltage. If the input voltage is below a threshold, then the bit may be set to "0" because the input voltage is below the voltage represented by the threshold value. This process continues for each threshold that is passed. As will be discussed below, actual comparisons may not be performed for all thresholds. For example, if the input voltage is determined to be under the ⅛ threshold, then comparisons with the ⅜ or ⅝ thresholds may not be performed. A person skilled in the art will appreciate how to determine a digital value from the comparisons based on the disclosure and teachings herein.

Comparator 102 makes comparison decisions using the thresholds. As will be discussed in more detail, the threshold being input into comparator 102 is changed when the input voltage passes a threshold being input into comparator 102. For example, multiplexer 104 may increment (either positively or negatively) the threshold when it is passed. At this point, comparator 102 compares the input voltage with the incremented threshold. This process continues for at least a sample phase. At the end or before the end of the sample phase, comparison decisions are made. This process will now be described in more detail with an example.

Figure 2A:
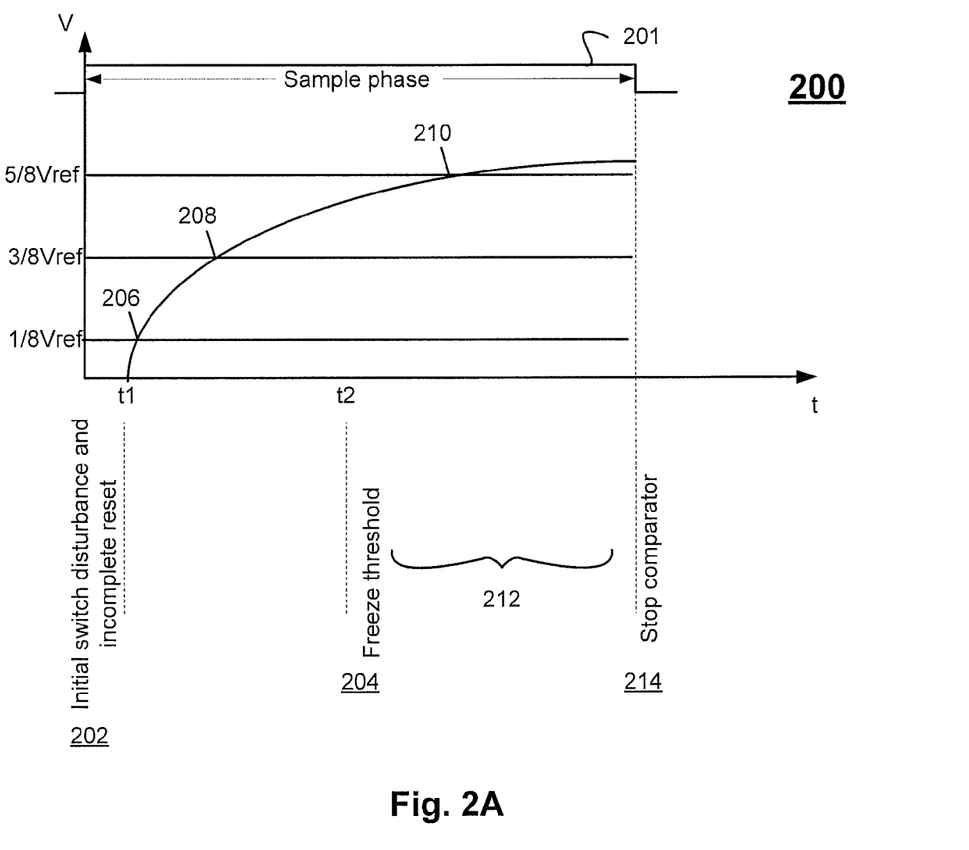
FIG. 2A shows an example of a graph of the analog input voltage according to one embodiment.

FIG. 2A shows an example of a graph 200 of the analog input voltage according to one embodiment. The X axis in graph 200 is time and the Y axis is a voltage level of the input voltage. Although only positive voltage values are shown, negative voltage values may also occur. Graph 200 is for a sample phase 201, which is the amount of time comparator 102 has to make comparison decisions.

At 202, initial switch disturbance and incomplete reset delay is allowed. This allows switches in comparator 102 to settle before a comparison is made. A first decision at time T>=t1 uses the threshold of 0 to determine if the input voltage is going positive or negative. In this case, the input voltage is going positive and the positive thresholds are used. However, although not shown, the voltage may go negative and the negative thresholds may be used.

Once the input voltage crosses the 0 threshold, the threshold may be incremented to the next threshold, the ⅛ Vref threshold in this case. For example, referring to FIG. 1, when the comparator output goes high because the input voltage goes above the 0 threshold, delay circuitry 106 outputs a selection signal to multiplexer 104 that causes multiplexor 104 to output an incremented threshold.

The threshold may be incremented every time the input voltage crosses a threshold before a freeze threshold time t2 at 204. For example, at 206, the input voltage crosses the ⅛ Vref threshold. At this point, comparator 102 may make a decision. For example, a logic high value may be output by comparator 102 to indicate that the input voltage is above the ⅛ Vref threshold. Also, at this point, the threshold is incremented to the next threshold. For example, delay circuitry 106 outputs a selection signal to multiplexer 104 that causes multiplexor 104 to output an incremented threshold.

Comparator 102 then compares the new threshold with the input voltage. A decision may be made when the input voltage goes above the threshold. For example, at 208, the input voltage has passed the ⅜ Vref threshold. At this point, comparator 102 makes a decision for the ⅜ Vref threshold. For example, a logic high value may be output by comparator 102 to indicate that the input voltage is above the ⅜ Vref threshold. Also, at this point, delay circuitry 106 outputs a selection signal to multiplexer 104 that causes multiplexor 104 to output an incremented threshold.

At 204, the threshold is frozen at the time t2. The threshold is frozen at the time t2 because the amount of change of the input voltage is not expected to increase past another threshold value during sample phase 201. For example, the input voltage may increase past the ⅝ threshold, but would not increase past the next threshold (if a next threshold exists). This is because a certain amount of time has been given for the input voltage to settle and it is known based on circuit characteristics that after this amount of settling, the input voltage may only change a certain amount. Thus, even if the input voltage passes the ⅝ Vref threshold, the threshold is not incremented after the freeze time.

Once the threshold is frozen, delay circuitry 106 may not input a signal into multiplexer 104 to increment the threshold until the sample phase is finished. This stops the increasing of a threshold if the input voltage goes above the threshold. For example, at 210, the threshold is not incremented.

Figure 2B:
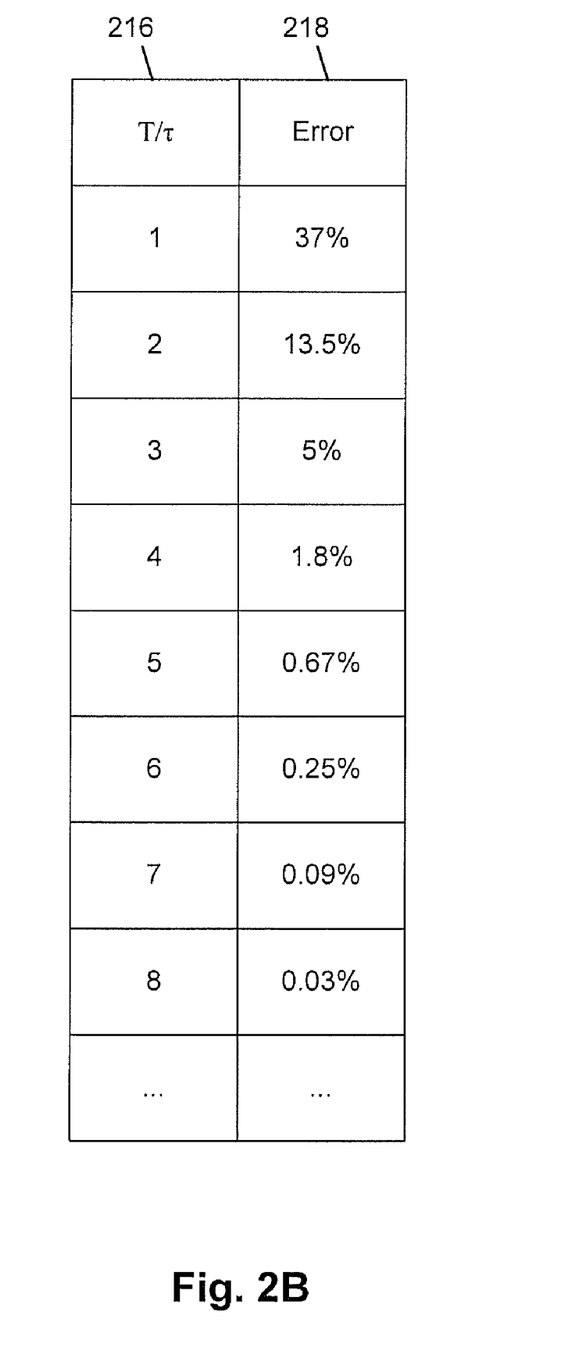
FIG. 2B shows an amount of error based on the time taken to make a decision according to one embodiment.

The freeze time may be determined based on an amount of error that can be tolerated in the conversion. FIG. 2B shows an amount of error based on the time taken to make a decision according to one embodiment. In a column 216, the times T=1, 2, 3 . . . x are shown. In a column 218, an error that may occur in the comparison decision is shown. The amount of time is $T/\tau$, where T is the amount of time in the sample phase and $\tau$ is a time constant that is set by the resistor-capacitor constant of the comparator circuit. For example, it is known the input voltage will rise or fall for a certain amount of time and then settle to a value.

If a decision by comparator 102 is determined after the time $T/\tau=1$, a 37% error is possible. This is because the input voltage takes a certain amount of time to settle to its final value. Thus, if the comparator output decision is made at $T/\tau=1$, then the error is 37% because the possible voltage change. At $T/\tau=2$, the error is 13.5%, which means that there may be a 13.5% chance in a wrong comparison decision after time $T/\tau=2$. The time in which the threshold is frozen determines the amount of possible error. For example, if the threshold is frozen a time $T/\tau=3$, a 5% error may occur. The amount of error that is tolerated may be a design preference for the ADC. In FIG. 2A, to allow for less than a 5% error, the time t2 is set at $T/\tau=3$. Although this amount of time is used, other time periods may be used.

Referring back to FIG. 2A, at 212, a time period is left for comparator 102 to make the last decision using the last threshold. The time that is given to make the last decision may be longer than the time taken to make the prior decisions. This is because the last decision may be the hardest to determine whether the input voltage is above or below the threshold. For example, the decision that the input voltage is above the ⅛ Vref and ⅜ Vref thresholds is an easier decision for comparator 102 than whether the input voltage is above or below the ⅝ Vref due to the closeness of the input voltage to the ⅝ Vref threshold.

If the input voltage goes above the ⅝ Vref threshold, then comparator 102 may make its decision at that point. The input voltage may settle such that comparator 102 can make its decision before the end of the sample phase. Also, if the input voltage does not go above the ⅝ Vref by the end of the sample phase, then the decision is also made indicating that the input voltage did not go above the ⅝ Vref threshold. At 214, the sample phase is finished and the comparator decisions may be output. At the end of the sample phase, delay circuitry 106 provides a reset to comparator 102 to start a sample phase over.

Figure 2C:
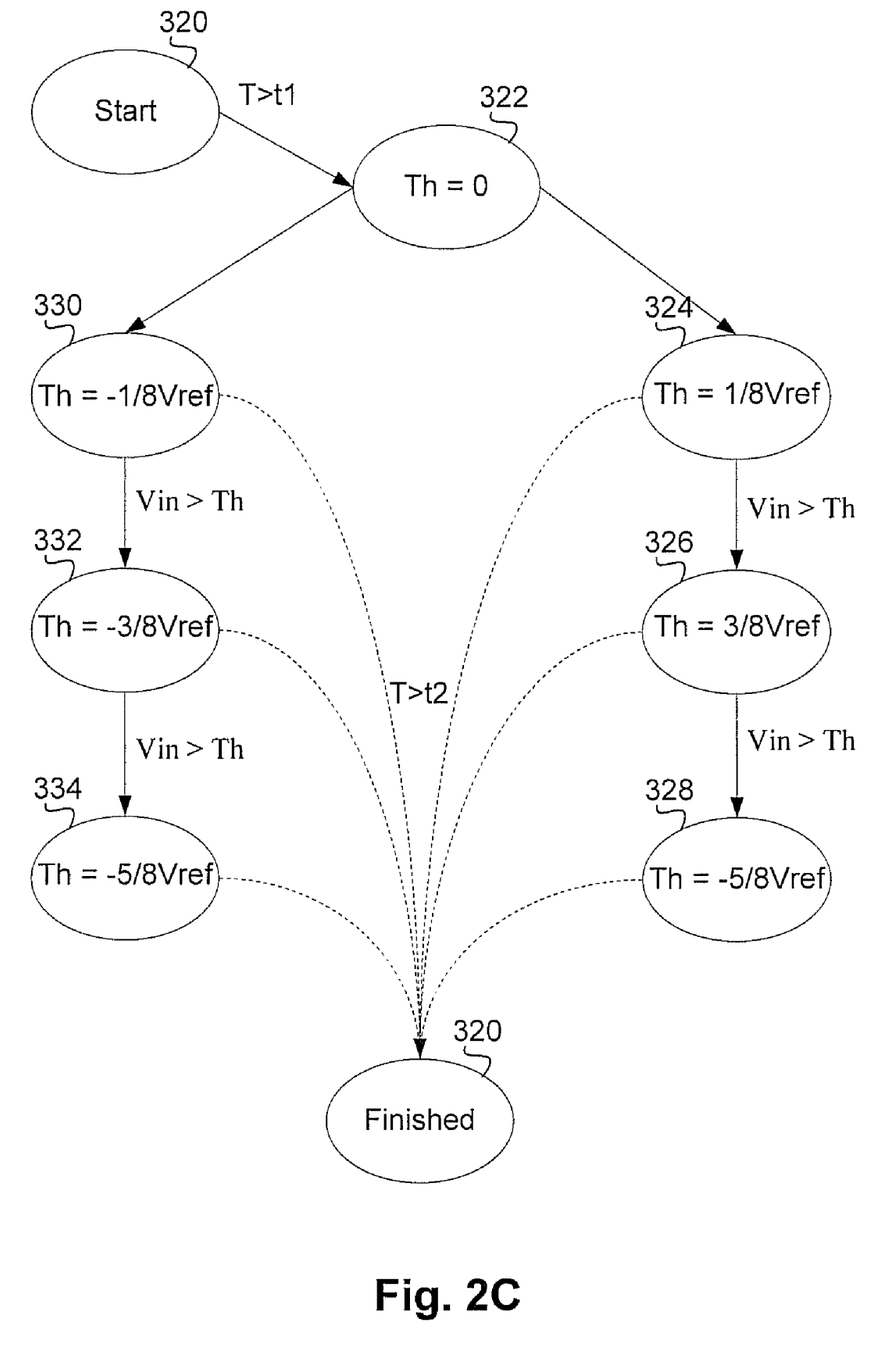
FIG. 2C shows a state diagram for FIG. 2A according to one embodiment.

FIG. 2C shows a state diagram for the analog input voltage depicted in FIG. 2A according to one embodiment. At 320, the process is started and an initial time for switch disturbance and resetting is provided. At a time greater than t1, the initial comparison with the threshold (Th) is performed at 322. Depending on whether the input voltage is positive or negative, different branches may be taken. For example, if the input voltage is positive, decisions are made at 324, 326, and 328, and if the input voltage is negative, decisions are made at 330, 332, and 334.

The input voltage is positive and thus is compared with the next threshold, such as the ⅛ Vref threshold at 324. When the input voltage is greater than the threshold (Vin>Th), then the threshold is incremented to the next threshold at 326. When the threshold passes the ⅜ Vref threshold, then the threshold is incremented to the next threshold, the ⅝ Vref threshold at 328. At a time greater than t2, the process is finished. If the input voltage had been going negative, then the input voltage would pass the negative threshold by going to a more negative value, and the next threshold would be incremented to a more negative threshold (e.g., −⅛ Vref to −⅜ Vref).

Figure 3A:
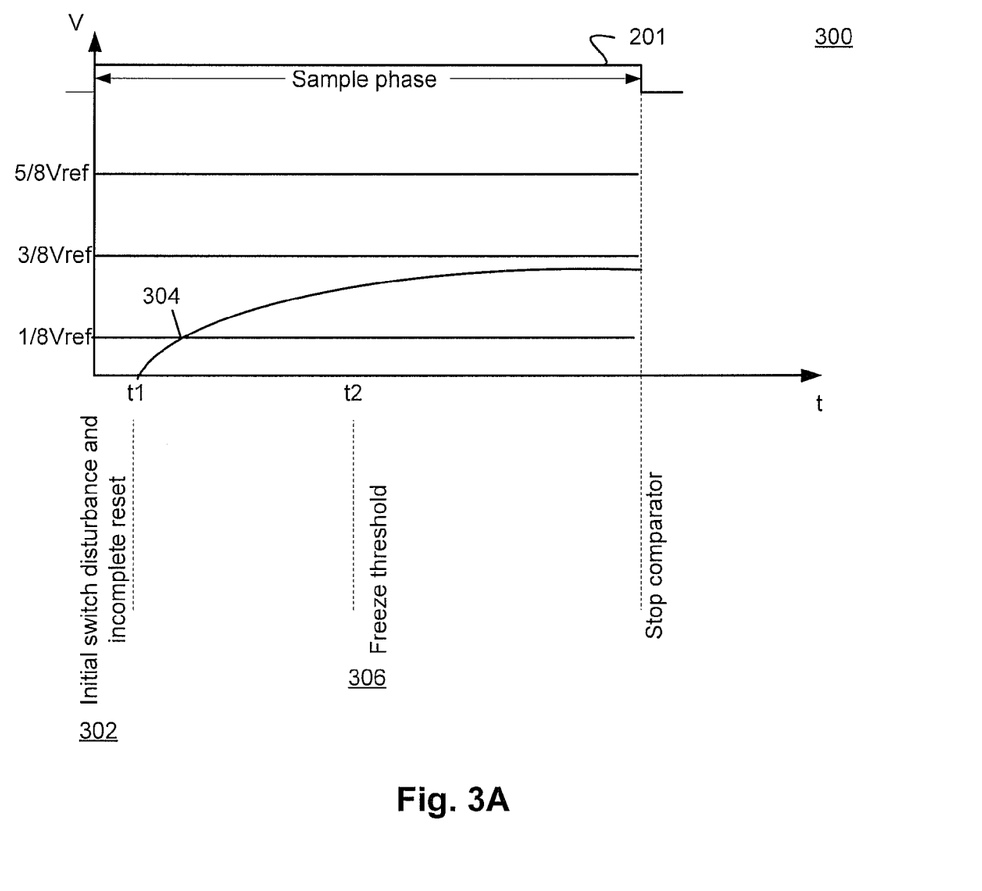
FIG. 3A shows an example of a graph for a sample phase according to one embodiment.

Although the example in FIG. 2A showed the input voltage going above three thresholds, the input voltage may not go past all of the thresholds. FIG. 3A shows an example of a graph 300 for a sample phase 201 according to another embodiment. At 302, the initial comparison with the 0 threshold is performed. The threshold is incremented to the ⅛ Vref threshold. At 304, the input voltage goes above the ⅛ Vref threshold and comparator 102 makes a decision. As described above, the threshold is then increased to the ⅜ Vref threshold. However, the input voltage does not go above the ⅜ Vref threshold by the time t2 occurs. At 306, the threshold is frozen. That is, the threshold ⅜ Vref is the final threshold that is input into comparator 102.

Comparator 102 then determines if the analog input voltage goes above the ⅜ Vref threshold. In this case, it does not. The decision for the ⅜ Vref threshold is then made by comparator 102. For example, the comparator output indicates that the input voltage did not go above the ⅜ Vref threshold. Also, the decision for the ⅝ Vref threshold is determined. For example, because the ⅝ Vref threshold was not received by comparator 102, then comparator 102 determines the decision for that threshold is that the input voltage is below the threshold (e.g., 0). Comparator 102 makes this decision because it is assumed the input voltage will not go above any thresholds that are not selected after the freeze time.

In another example, if the input voltage goes above the ⅜ Vref threshold, the threshold output by multiplexer 104 would be increased. The comparison decision would indicate that the input voltage went above the ⅜ Vref threshold but did not go above the ⅝ Vref threshold.

The decision may be made before the end of sample phase 201. For example, the decision for the ⅝ Vref threshold may be made at a time T=t2. This is because it is known that the input voltage has settled and it will not go above the ⅝ Vref voltage. Thus, comparator 102 can make this decision before the sample phase is finished. The decisions for lower thresholds may also be made before the end of sample phase 201. For example, the decision as to whether the input voltage goes above the ⅛ Vref threshold may be made before the end of the sample phase 201.

Figure 3B:
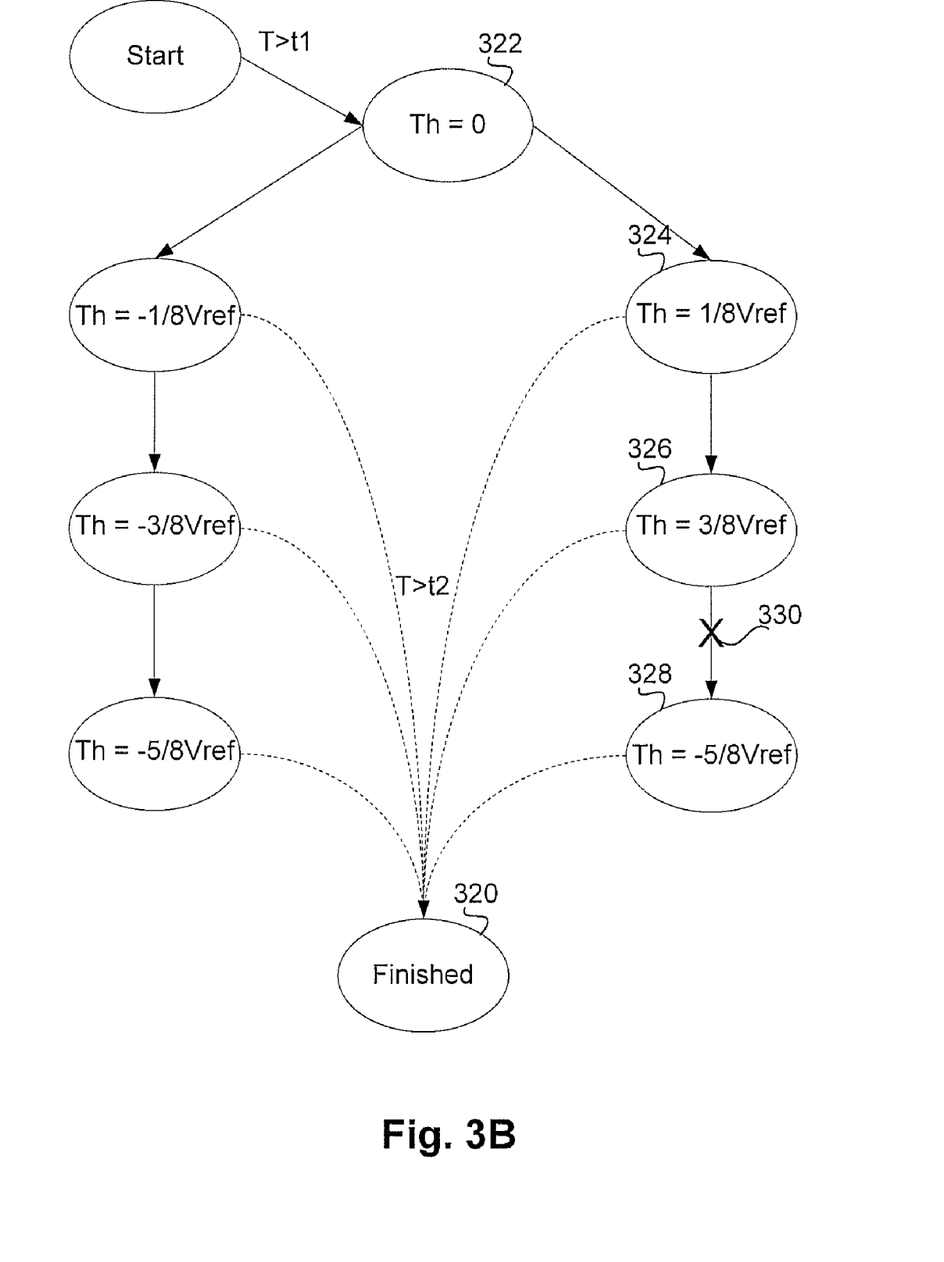
FIG. 3B shows an example of a state diagram for FIG. 3A according to one embodiment.

FIG. 3B shows an example of a state diagram for FIG. 3A according to one embodiment. The input voltage goes above the 0 threshold at 322 and the ⅛ Vref threshold at 324. At 326, when a time is greater than t2, a decision is made as to whether or not the input voltage went above the ⅜ Vref threshold. Also, after a certain time T>t2, the decision at 328 may be made. However, the ⅝ Vref threshold is not input into comparator 102. The "X" at 330 indicates the ⅝ Vref threshold is not selected.

Figure 4:
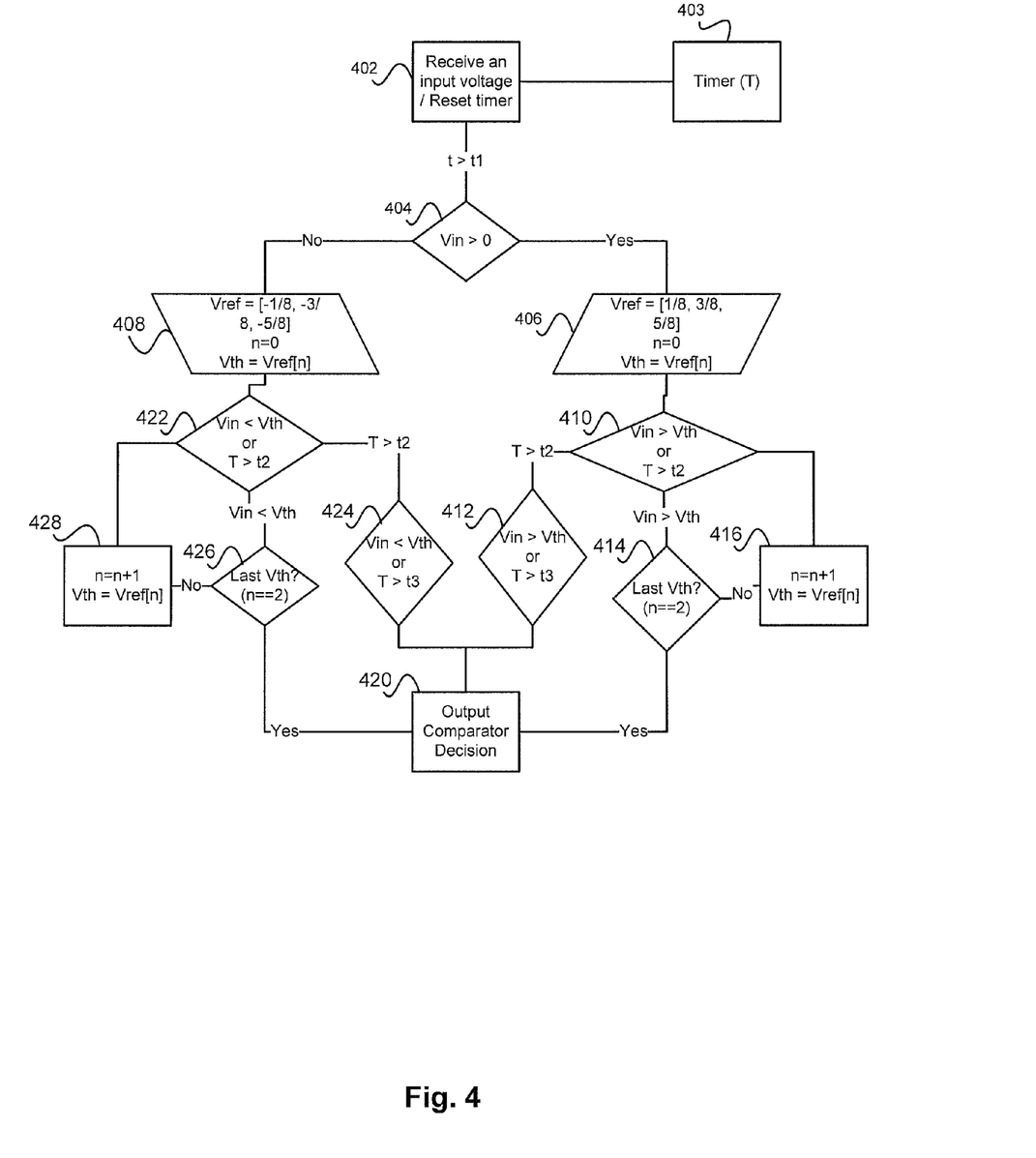
FIG. 4 depicts a method for determining a comparator decision for an analog to digital conversion according to one embodiment.

FIG. 4 depicts a method for determining a comparator decision for an analog to digital conversion according to one embodiment. At 402, comparator 102 receives an input voltage and resets a timer (T) 403 for the sample phase. At 404, comparator 102 determines if the input voltage is greater than 0. If so, positive threshold values are used as shown in 406 as Vref=[⅛, ⅜, and ⅝]. Also, a variable n is set to 0. The variable n is used to select the threshold voltage from the set of [⅛, ⅜, and ⅝]. For example, if n=0, then ⅛ Vref is selected; if n=1, ⅜ Vref is selected, and if n=2, ⅝ Vref is selected. If the input voltage is not greater than 0, positive threshold values are used as shown in 408 as Vref=[−⅛, −⅜, and −⅝]. Also, a variable n is set to 0. The variable n is used to select the threshold voltage from the set of [−⅛, −⅜, and −⅝].

If the input voltage is greater than 0, at 410, comparator 102 determines if the input voltage Vin is greater than the threshold (Vth) or if the time T is greater than t2, where t2 is the freeze point. At 412, if the time is greater than t2, the threshold is then frozen (if it has not already been). Also, at 412, comparator 102 determines if the input voltage Vin is greater than the threshold (Vth) or if the time T is greater than t3, where t3 is the end of the sample phase. If the input voltage is greater than the threshold voltage or the time is greater than t3, then at 420, the comparator decision is output.

At 414, if the input voltage is greater than the threshold voltage, it is determined if this is the last threshold (n==2). If this is the last threshold voltage, then at 420, the comparator decision is output. If not, at 416, the threshold is adjusted. For example, n is incremented and the threshold voltage is set to the new value. The process then reiterates to 410.

If the input voltage is less than 0, at 422, comparator 102 determines if the input voltage Vin is less than the threshold (Vth) or if the time T is greater than t2. At 424, if the time is greater than t2, the threshold is then frozen (if it has not already been). Also, at 424, comparator 102 determines if the input voltage Vin is less than the threshold (Vth) or if the time T is greater than t3. If the input voltage is less than the threshold voltage or the time is greater than t3, then at 420, the comparator decision is output.

At 426, if the input voltage is less than the threshold voltage, it is determined if this is the last threshold (n==2). If this is the last threshold voltage, then at 420, the comparator decision is output. If not, at 428, the threshold is adjusted. For example, n is incremented and the threshold voltage is set to the new value. The process then reiterates to 422.

Accordingly, a single comparator 102 is provided that can perform an N bit solution comparison for a stage in an ADC. In one embodiment, the ADC may be included in a wireless transceiver; however, other implementations may be used. A multiplexer 104 is used to select threshold values to input into comparator 102. The reference is frozen after a certain amount of time. After the sample time is finished, a comparator output is determined based on the comparison decisions made by comparator 102.

By using the single comparator 102, area is saved on the chip. Also, by freezing the threshold, less disturbance in the comparison occurs, which may lead to a more accurate comparison decision.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method comprising:
   receiving an analog input voltage;
   receiving a threshold from a plurality of thresholds;
   performing, at a comparator, a comparison of the analog input voltage with the received threshold;
   outputting a comparison decision based on the comparison of the analog input voltage with the received threshold;
   determining if the threshold should be adjusted based on the comparison;
   adjusting the threshold when it is determined the threshold should be adjusted;
   determining a time during a sample phase;
   freezing the threshold when the time is determined such that the threshold is not adjusted again until the sample phase ends, wherein before the time, the threshold was adjustable;
   determining a last comparison decision for the sample phase after the freezing of the threshold; and
   outputting an output value for the sample phase based on comparison decisions determined during the sample phase, wherein the output value is for converting the analog input voltage to a digital value.

2. The method of claim 1, wherein the threshold is not adjusted if the time period has elapsed even if the analog input voltage has passed the threshold.

3. The method of claim 1, further comprising:
   determining a plurality of comparison decisions based on comparisons of the analog input voltage with thresholds in the plurality of thresholds,
   wherein the output value is based on the plurality of comparison decisions.

4. The method of claim 3, wherein a comparison decision in the plurality of comparison decisions is based on a threshold in the plurality of thresholds not being used in the comparisons.

5. The method of claim 1, wherein the plurality of comparison decisions correspond to a plurality of bits in the digital value.

6. The method of claim 1, wherein adjusting the threshold comprises adjusting the threshold to a threshold selected from the plurality of thresholds if the analog input voltage has passed the threshold.

7. The method of claim 6, wherein determining if the threshold should be adjusted comprises:
   receiving the comparison decision from the comparator; and
   determining the threshold should be adjusted if the analog input voltage has passed the threshold based on the output value.

8. An apparatus comprising:
   a multiplexer configured to output a threshold from a plurality of threshold values;
   a comparator configured to:
   receive an analog input voltage;
   receive the threshold from the multiplexer;
   perform a comparison of the analog input voltage with the received threshold; and
   output a comparison decision based on the comparison of the analog input voltage with the received threshold,
   circuitry configured to:
   determine if the threshold should be adjusted based on the comparison;
   cause the multiplexer to adjust the threshold when it is determined the threshold should be adjusted;
   determine a time during a sample phase;
   freeze the threshold when the time is determined such that the threshold is not adjusted again until the sample phase ends, wherein before the time, the threshold was adjustable;
   determine a last comparison decision for the sample phase after the freezing of the threshold; and output an output value for the sample phase based on comparison decisions determined during the sample phase, wherein the output value is for converting the analog input voltage to a digital value.

9. The apparatus of claim 8, wherein the circuitry is configured to output a selection signal to the multiplexer to cause the multiplexer to output a threshold selected from the plurality of thresholds.

10. The apparatus of claim 9, wherein the circuitry is configured to:
determine when the time in the sample phase is determined; and
not output the selection signal thereby freezing the threshold such that the threshold is not adjusted again until the sample phase ends.

11. The apparatus of claim 9, wherein the circuitry is configured to:
receive the comparison decision for the threshold from the comparator;
determine if the comparison decision indicates the analog input voltage has passed the threshold;
output the selection signal to the multiplexer to cause the multiplexer to adjust the threshold if the analog input voltage has passed the threshold; and
not output the selection signal to the multiplexer if the analog input voltage has not passed the threshold.

12. The apparatus of claim 8, wherein the multiplexer comprises a plurality of inputs for the plurality of thresholds.

13. The apparatus of claim 8, wherein the plurality of thresholds comprise different portions of a reference value.

14. The apparatus of claim 13, wherein the different portions of the reference value are used to determine a bit in the digital value.

15. The apparatus of claim 8, wherein the comparator is configured to:
determine a plurality of comparison decisions based on comparisons of the analog input voltage with thresholds in the plurality of thresholds,
wherein the output value is based on the plurality of comparison decisions.

16. The apparatus of claim 15, wherein a comparison decision in the plurality of comparison decisions for the output value is determined when the threshold has been passed by the analog input voltage.

17. The apparatus of claim 15, wherein a comparison decision in the plurality of comparison decisions is based on a threshold in the plurality of thresholds not being used in the comparisons by the comparator.

18. An analog to digital converter comprising the apparatus of claim 8, wherein the apparatus is a stage in the analog to digital converter.

* * * * *